United States Patent
Dagan et al.

(10) Patent No.: US 12,068,028 B2
(45) Date of Patent: Aug. 20, 2024

(54) CIRCUITRY FOR PARALLEL SET AND RESET OF RESISTIVE RANDOM-ACCESS MEMORY (RERAM) CELLS

(71) Applicant: Weebit Nano Ltd., Hod Hasharon (IL)

(72) Inventors: Lior Dagan, Ram-On (IL); Ilan Sever, Kfar Vitkin (IL)

(73) Assignee: WEEBIT NANO LTD., Hod Hasharon (IL)

( * ) Notice: Subject to any disclaimer, the term of this patent is extended or adjusted under 35 U.S.C. 154(b) by 317 days.

(21) Appl. No.: 17/653,353

(22) Filed: Mar. 3, 2022

(65) Prior Publication Data
US 2022/0284955 A1 Sep. 8, 2022

Related U.S. Application Data

(60) Provisional application No. 63/156,077, filed on Mar. 3, 2021.

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/0038* (2013.01); *G11C 13/004* (2013.01); *G11C 13/0064* (2013.01); *G11C 13/0097* (2013.01); *G11C 13/0002* (2013.01); *G11C 13/003* (2013.01); *G11C 2013/0078* (2013.01); *G11C 2213/79* (2013.01); *G11C 2213/82* (2013.01)

(58) Field of Classification Search
CPC ............ G11C 13/0069; G11C 13/0026; G11C 13/0028; G11C 13/0038; G11C 13/004; G11C 13/0064; G11C 13/0097; G11C 2013/0076; G11C 2013/0078; G11C 2213/79; G11C 2213/82; G11C 13/003; G11C 16/10; G11C 16/3404

See application file for complete search history.

(56) References Cited

U.S. PATENT DOCUMENTS

| | | | |
|---|---|---|---|
| 8,995,169 B1 | 3/2015 | Bandyopadhyay et al. | |
| 9,082,964 B2 | 7/2015 | Hong et al. | |
| 9,312,002 B2 | 4/2016 | Navon et al. | |
| 9,368,207 B2 | 6/2016 | Bandyopadhyay et al. | |
| 9,947,399 B2 | 4/2018 | Navon et al. | |
| 9,953,726 B1 * | 4/2018 | Irby | G11C 13/0069 |
| 10,147,485 B2 | 12/2018 | Hecht | |

(Continued)

*Primary Examiner* — Huan Hoang
*Assistant Examiner* — Justin Bryce Heisterkamp
(74) *Attorney, Agent, or Firm* — M&B IP Analysts, LLC

(57) ABSTRACT

A resistive random-access memory (ReRAM) array with parallel reset and set programming and a method for programming is presented. The ReRAM array includes a plurality of ReRAM cells arranged in an array, wherein the array includes a plurality of rows and a plurality of columns, wherein at least two ReRAM cells of an array includes a word, wherein each ReRAM cell includes a select device having a control port, a first port, and a second port, and a resistive element; and a plurality of controllers, wherein the output of each of the plurality of controllers cause a reset programming or a set programming of the ReRAM cell in the column of the plurality of ReRAM cells that has the respective word line activated; such that the reset programming and the set programming occur in parallel.

9 Claims, 6 Drawing Sheets

(56) References Cited

U.S. PATENT DOCUMENTS

| | | | |
|---|---|---|---|
| 10,872,661 B2 | 12/2020 | Xue et al. | |
| 2009/0135637 A1* | 5/2009 | Takase | G11C 13/0038 |
| | | | 365/230.06 |
| 2013/0242641 A1* | 9/2013 | Nakai | G11C 13/0069 |
| | | | 365/148 |
| 2013/0250657 A1* | 9/2013 | Haukness | G11C 13/0064 |
| | | | 365/148 |
| 2015/0364186 A1* | 12/2015 | Ryu | G11C 13/0026 |
| | | | 365/63 |
| 2016/0118120 A1* | 4/2016 | Tseng | G11C 13/0026 |
| | | | 365/148 |
| 2017/0301399 A1* | 10/2017 | Han | G11C 13/0097 |
| 2021/0280223 A1* | 9/2021 | Muzzetto | G11C 13/0064 |

\* cited by examiner

-- Prior Art --

CIRCUITRY FOR PARALLEL SET AND RESET OF RESISTIVE RANDOM-ACCESS MEMORY (RERAM) CELLS

CROSS-REFERENCE TO RELATED APPLICATIONS

This application claims the benefit of U.S. Provisional Application No. 63/156,077 filed on Mar. 3, 2021, the contents of which are hereby incorporated by reference.

TECHNICAL FIELD

The invention generally relates to resistive random-access memory (ReRAM) arrays, and more particularly to the programming of a plurality of ReRAM cells.

BACKGROUND

Resistive random-access memories (ReRAMs) are, unlike, for example, Flash memory cells, bit programmable. That is, every bit of the array may be programmed separately from any other bit being programmed. When used in random access mode, write-over is permitted, meaning that a bit may be flipped from '0' to '1' (set) or from '1' to '0' (reset). For example, a set operation may be deemed to decrease the resistance of the resistive element of the ReRAM cell, while a reset operation may be deemed to increase the resistance of the resistive element of the ReRAM cell. In order to perform the programming of a ReRAM cell, the process described in FIG. 1 is used. For example, a byte of memory contains '00110101'. It may be now desired to be changed to contain '01011100'. It is clear that not all the bits need to be changed. The first, fourth, sixth, and seventh bits beginning from the left, do not need to be changed. However, the rest of the bits require a set or reset operation as the case may be.

The following steps will therefore take place, according to current solutions, and as shown in FIG. 1. First the new data is compared to the old data so as to establish which bits need to be changed. This has to be separated between bits that require to be 'set' (for example, changed from '0' to '1') and bits to be 'reset' (for example, need to be changed from '1' to '0'). That requires the creation of masks to allow proper programming of the respective cells. Thereafter, for example, the 'set' process takes place, then a verification, thereafter the 'reset' process takes place, and this is verified too. The 'reset' is performed after the 'set' operation.

Therefore, the overall time to program the ReRAM word includes the serial time it takes to set and reset the bits plus other overhead activities, such as the creation of masks and the validation.

It would therefore be advantageous to provide a solution and corresponding circuitry that would overcome the deficiencies noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a resistive random-access memory (ReRAM) array with parallel reset and set programming. The ReRAM array comprises: a plurality of ReRAM cells arranged in an array, wherein the array includes a plurality of rows and a plurality of columns, wherein at least two ReRAM cells of an array includes a word, wherein each ReRAM cell includes a select device having a control port, a first port, and a second port, such that under the control of a signal applied to the control port, current may flow or not flow between the first port and the second port, and a resistive element including a top electrode (TE) and a bottom electrode (BE), wherein the control port is connected to a word line, the first port connected to a source line, the TE connected to a bit line, and the second port is connected to the BE; and a plurality of controllers, wherein the output of each of the plurality of controllers cause a reset programming or a set programming of the ReRAM cell in the column of the plurality of ReRAM cells that has the respective word line activated; such that the reset programming and the set programming occur in parallel.

Certain embodiments disclosed herein include a method for parallel reset and set programming of a resistive random-access memory (ReRAM) word of a ReRAM array. The method comprises: receiving a new word to be programmed into the ReRAM word of the ReRAM array, wherein the new word contains a plurality of bits, each bit corresponding to a ReRAM cell; comparing a content of the ReRAM word to be programmed to the received new word; determining, based on the comparison, a plurality of enable signals to each source line and bit line of the ReRAM word to be programmed; generating a mask to disable programming of a first portion of the plurality of bits of the ReRAM word that are not to be programmed and enable programming of a second portion of the plurality of bits of the ReRAM word that are to be programmed; performing parallel reset and set programming of the ReRAM word to be programmed while applying the mask; terminating programming upon checking the content of the ReRAM word that was programmed to be successful; and repeating programming upon determination that the content of the ReRAM word does not match the new word, wherein the repeating programming is performed using the received new word.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
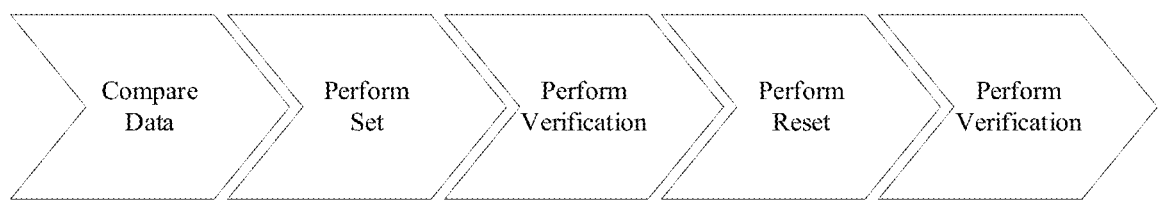
FIG. 1 is a flow diagram of a conventional process to perform programming of a plurality of resistive random-access memory (ReRAM) cells (prior art).

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The term "programming" may refer herein to the initial setting of the resistor from its pristine condition, also known as forming of the ReRAM resistor. It may further refer to either set or reset of the ReRAM resistor as the case may be. The discussion below is with regard to either the form-programming or set-programming of the ReRAM resistive element. However, it should be noted that the circuits may be so adapted to handle also reset-programming without departing from the scope of the present disclosure.

A circuitry for increasing programming speed of a resistive random-access memory (ReRAM) word by performing parallel set and reset operation is presented. It thereby overcomes deficiencies of serial set and reset programming of ReRAM cells and speeds up the programming process. Control circuitry is provided for smart parallel programming of a word line of the ReRAM array. Cells that do not have to be changed in a word line are masked. A method of operation of the circuitry achieves such parallel programming process.

Figure 2:
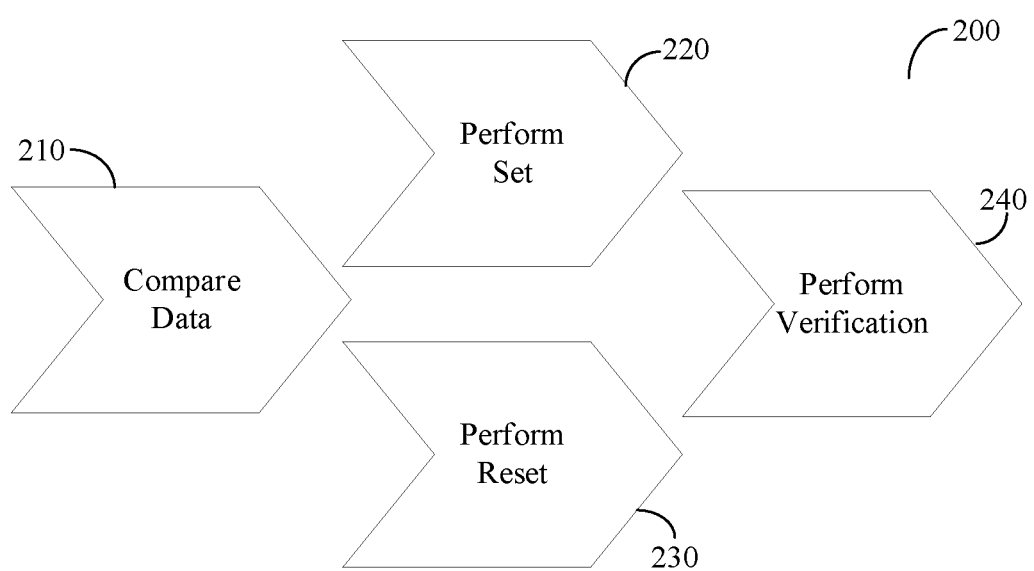
FIG. 2 is a flow diagram of a process to perform programming of a plurality of ReRAM cells according to an embodiment.

FIG. 2 depicts a flow diagram 200 of a process to perform programming of a plurality of ReRAM cells according to an embodiment. At 210, comparison of data takes place. That is, if, for example, a byte of memory contains '00110101' to be changed to '01011100.' the first, fourth, sixth, and seventh bits, beginning from the left, do not need to be changed. The bits to retain unchanged may be masked from being changed as further described herein. For example, such a mask in this case may be 01101001, where a '1' designates a bit that needs to be programmed, i.e., set or reset as the case may be. Further, as a result of the comparison in the example case, the second and fifth bits of the ReRAM word need to be 'set', i.e., be flipped from '0' to '1', while the third and eighth bits of the ReRAM word need to be 'reset', i.e., be flipped from '1' to '0'.

At 220, a 'set' programming may be performed to flip a bit of the ReRAM word from, for example, '0' to '1'. At 230, a 'reset' programming may be performed to flip a bit of the ReRAM word from, for example, '1' to '0'. Reset and set are opposite operations. It should be appreciated that, in an embodiment, the logical function of set programming and reset may be the opposite of the description provided herein, i.e., set may mean flipping from '1' to '0' and reset flipping a bit from '0' to '1' that is only the logical association of the operations performed.

As shown herein, and according to the disclosed embodiments, the provided circuitry and method of operation allow parallel performance of the 'reset' 230 and 'set' 220 operations. Thereafter, at 240, verification may be performed to verify that the desired new data was written into the ReRAM word. The programming steps presented herein that allow parallel programming may provide a significant speed advantage over the solutions discussed in the related art that performs step-by-step sequential programming and verification.

Figure 3:
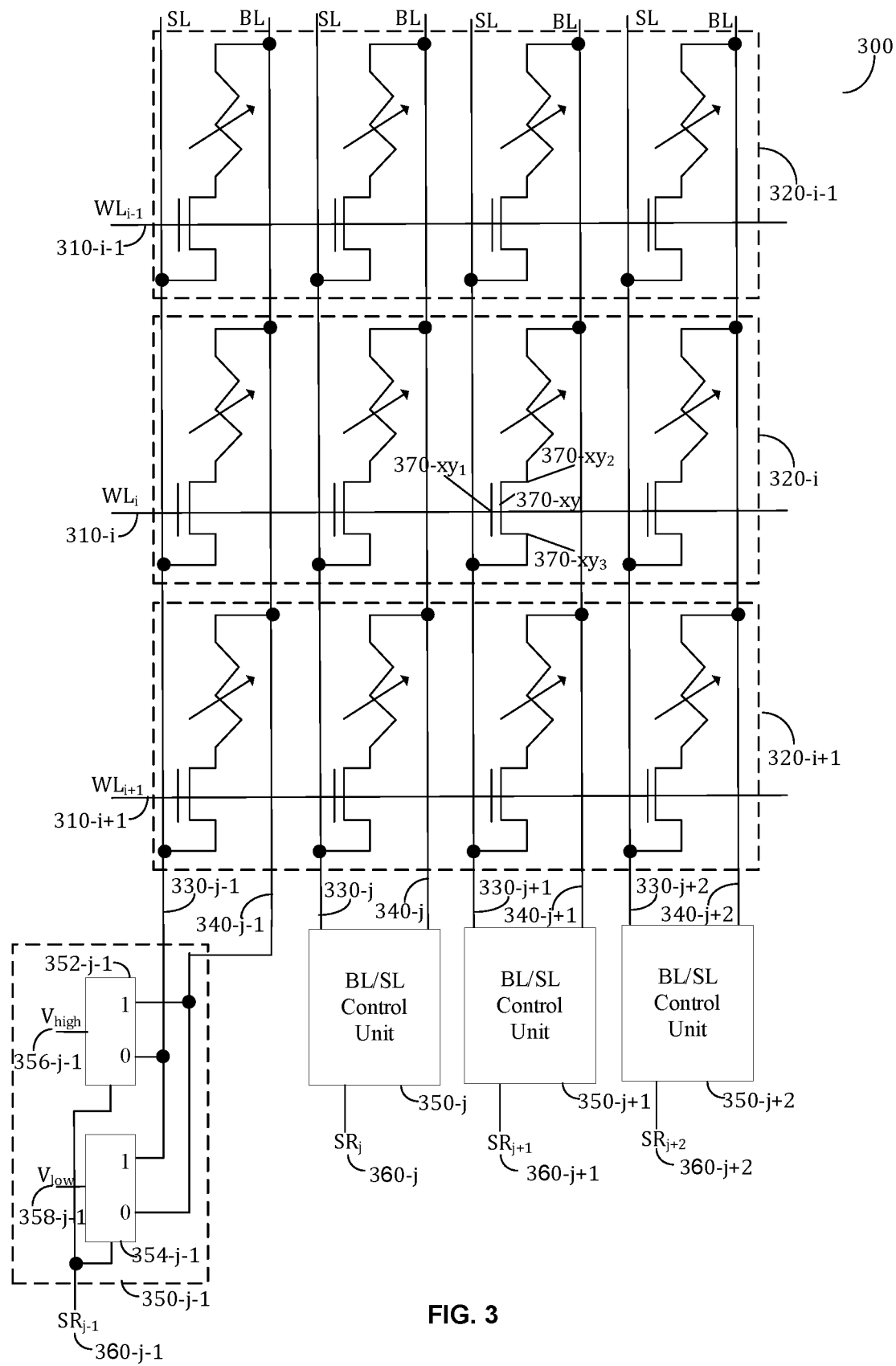
FIG. 3 is a schematic diagram of a ReRAM array equipped with bit line and bit source controllers for parallel reset and set programming according to an embodiment.

FIG. 3 is an example schematic diagram 300 of a ReRAM array equipped with bit line 340, source line 330, and controllers 350 for parallel reset and set programming according to an embodiment. A portion of a ReRAM array is shown including of three ReRAM words 320, specifically ReRAM word 320-$i$-1, 320-$i$, and 320-$i$+1.

Each ReRAM word includes four ReRAM cells, each ReRAM cell including a ReRAM resistive element and a control transistor, for example, an N-type field effect transistor (N-FET). It should be noted that the number of ReRAM cells in a ReRAM word may vary, 4-bits in the instant example, 8-bits in another example, and any other number of bits, all without departing from the scope of the disclosed embodiments. Each ReRAM word is controlled by a word-line 310, for example WLi-1 310-$i$-1, WLi 310-$i$, and WLi+1 310-$i$+1. When a word-line is selected, for example WLi 310-$i$, then the ReRAM cells of the ReRAM word may be programmed according to the disclosed embodiments.

Accordingly, the set of a ReRAM cell is performed by applying a high voltage on a ReRAM cell's bit line, for example, a bit line 340-$j$-1 and a low voltage (e.g., ground) on the ReRAM cell's source line, for example source line 330-$j$-1. Such programming may be achieved when the word line is selected, for example, word line 310-$i$. The ReRAM cells in other not selected word lines, for example word line 310-$i$+1 shall not be programmed in this case set. A reset of a ReRAM cell is done by applying a high voltage on a ReRAM cell's source line, for example source line 330-$j$-1 and a low voltage (e.g., ground) on the ReRAM cell's bit line, for example bit line 340-$j$-1. By using multiplexers, as described herein, the set and reset operations of bits in the same word line may be accomplished in parallel.

It should be understood that the value of high voltage used for the set operation and the value high voltage used for the reset operation may be different without departing from the scope of the disclosed embodiments.

It should be further noted that the FETs are used as a three-port select device and may be a MOSFET (metal-oxide-silicon field-effect transistor), FinFET (fin field-effect transistor), silicon-on-insulator (SOI) FET, and other like select devices, for example bipolar junction transistor (BJT), all without departing from the scope of the disclosed embodiments. Such select devices control through a control port 370-$xy_1$, for example the gate of a FET 370-$xy$, the flow of current between a first port of the select device, for example a source 370-$xy_3$ of the FET 370-$xy$, and a second port of the FET, for example the drain port 370-$xy_2$ of the FET 370-$xy$. In this case each of x and y may be an integer referring to a column and a line and defining the location of a FET within the ReRAM array.

As noted, programming of a ReRAM array may be performed on each bit that is arranged as columns of bits in each word. The source of each N-FET in a column of bits is connected to the source line (SL), for example source lines 330-$j$-1, 330-$j$, 330-$j$+1, and 330-$j$+2. The drain of each N-FET is connected to the bottom electrode (BE) of the resistive element of the ReRAM cell, while the top electrode (TE) is connected to a bit line (BL), for example, bit lines 340-$j$-1, 340-$j$, 340-$j$+1, and 340-$j$+2 in FIG. 3. To each corresponding pair of source line (SL) 330 and bit line (BL)

340, a BL/SL controller 350 is connected. That is, BL/SL controller 350-*j*–1 is connected to source line 330-*j*–1 and bit line 340-*j*–1, BL/SL controller 350-*j* is connected to source line 330-*j* and bit line 340-*j*, and so on.

Each BL/SL controller 350 (e.g., 350-*j*–1, 350-*j*, 350-*j*+1, 350-*j*+2) includes a first multiplexer 352 and a second multiplexer 354. It should be noted that FIG. 3 shows components of only a single BL/SL controller 350-*j*–1 for simplicity and illustrative purposes. The first multiplexer 352 receives as an input $V_{high}$ 356 and, under a set/reset (SR) signal 360, operates the multiplexer to transfer $V_{high}$ 356 to either a first output of the first multiplexer 352 or a second output of the first multiplexer 352, depending on the signal SR 360 of '0' or '1'. The first output of the first multiplexer 352 is connected to a source line 330, therefore in the case of the first multiplexer 352-*j*–1, the first output ('0') is connected to the source line 330-*j*–1.

The second output of the first multiplexer 352 is connected to a bit line 340, therefore in the case of the first multiplexer 352-*j*–1, the second output ('1') is connected to the bit line 340+1. The second multiplexer 354 receives as an input $V_{low}$ 358 and, also under the control of SR signal 360, operates the multiplexer 354 to transfer $V_{low}$ 358 to either a first output of the second multiplexer 354 or a second output of the second multiplexer 354.

The first output of the second multiplexer 354 is connected to a bit line 340, therefore in the case of the second multiplexer 354-*j*–1 its first output ('0') is connected to the bit line 340-*j*–1. The second output of the second multiplexer 354 is connected to a source line 330, therefore in the case of the second multiplexer 354-*j*–1 its second output ('1') is connected to the source line 330-*j*–1. For a 'reset' programming of a ReRAM cell applying SR='0' will provide the necessary polarity at the respective source line 330 and bit line 340, and perform a 'reset' programming of the ReRAM word that has an active word line 310. When it is desired to perform a 'set' programming of a ReRAM cell then applying SR='1' will provide the necessary polarity at the respective source line 330 and bit line 340, and perform a 'set' programming of the ReRAM word that has an active word line 310. For those ReRAM cells within a word to be programmed that are not to be changed, the $V_{high}$ 356 signal may be kept at a low voltage (e.g., ground) thus preventing that particular ReRAM cell from being activated even if the respective word line 310 is active.

As an example of the parallel programming capabilities of the disclosed embodiments, consider the word line activated by WLi 310-*i*. For the purpose of the example the ReRAM cells of that word 320-*i* are programmed as '0110'. Assuming now that this word 320-*i* needs to be programmed to '0101' it means that a mask of '0011' is to allow for the bits in columns 'j–1' and 'j' to remain unchanged, while the bits in columns 'j+1' and 'j+2' allowed to be programmed. With WLi 310-*i* active for programming the mask will prevent BL/SL controllers 350-*j*+1 and 350-*j* to provide voltages to respective source lines and bit lines and therefore their respective ReRAM cells in word 320-*i* will not be programmed, as also further explained herein.

As for the other two ReRAM cells of word 320-*i*, one is to be programmed from '1' to '0', i.e., be reset, while the other is to be programmed from '0' to '1', i.e., be set. Therefore, SRj+1 360-*j*+1 shall be at '0' while SRj+2 360-*j*+2 shall be at '1'. As a result, BL 330-*j*+1 is at low voltage and SL 330-*j*+1 is at high voltage, while BL 330-*j*+2 is at high voltage and SL 330-*j*+2 is at low voltage. Therefore, parallel programming of both 'set' and 'reset' is made possible. A further explanation is provided herein with respect of FIG. 6.

Figure 4:
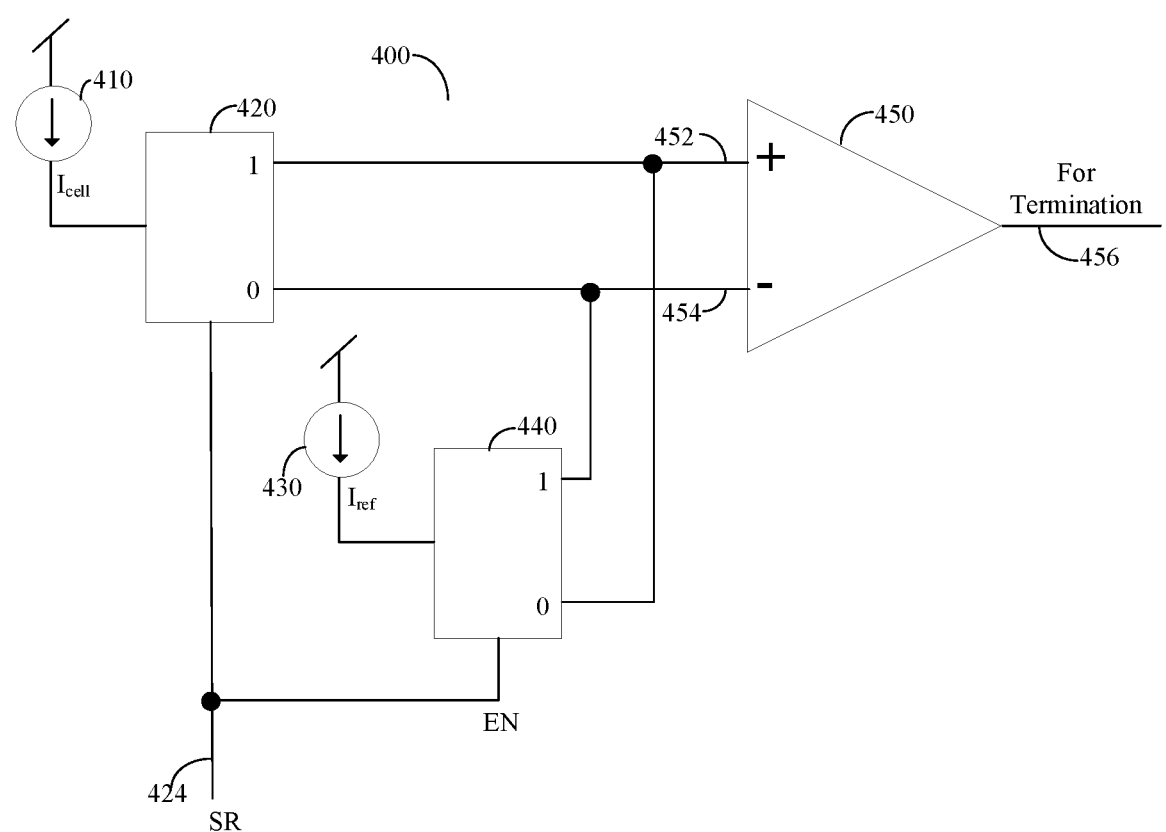
FIG. 4 is a schematic diagram of a programming termination circuitry according to an embodiment.

FIG. 4 is an example of a schematic diagram of a programming termination circuitry 400 according to an embodiment. Termination circuitry is used to terminate programming of a ReRAM cell upon reaching the desired level of programming. The particular termination circuitry 400 is adapted to support the ability of parallel set and reset programming of ReRAM cells in the same word line. It is therefore necessary for the termination circuitry to be able to switch in a similar way that is used for the source line 330 and the bit line 340 as discussed herein. The termination of programming may be achieved by causing $V_{high}$ 356 to become instead a low voltage thereby terminating the programming process of the ReRAM cell, while other ReRAM cells, which may be taking longer to program, remain unaffected. A termination signal 456 is provided by a comparator 450 that has a '+' input 452 and '–' input 454. The ReRAM cell current $I_{cell}$ 410 is multiplexed by a first multiplexer 420 responsive of a set/reset (SR) 424 to either a first output ('0') that is connected to input 454 of the comparator 450, or to a second output ('1') that is connected to input 452 of the comparator 450. The SR signal 424 for a particular ReRAM cell is the same SR signal used and explained with respect of FIG. 3 (SR signal 360). The reference current may be measured from the $V_{high}$ input 356, for example 356-*j*–1. A reference current $I_{ref}$ 430 is multiplexed by a second multiplexer 440 responsive of the SR signal 424 to either a first output ('0') that is connected to input 452 of the comparator 450, or to a second output ('1') that is connected to input 454 of the comparator 450. In the case of set, the resistance of the ReRAM cell is changed from high to low, and thus the ReRAM current 410 increases until it becomes higher than the reference current 430. At that time, the comparator 450 flips and issues the termination signal 456. In the case of reset, the resistance of the ReRAM cell is changed from low to high, and thus the ReRAM current 410 decreases until it becomes lower that the reference current 430. At that time, the comparator 450 flips and issues the termination signal 456. As a result, and as discussed herein, the programming termination circuitry 400 operates for both cases of set and reset programming of the ReRAM cell as the case may be.

Figure 5:
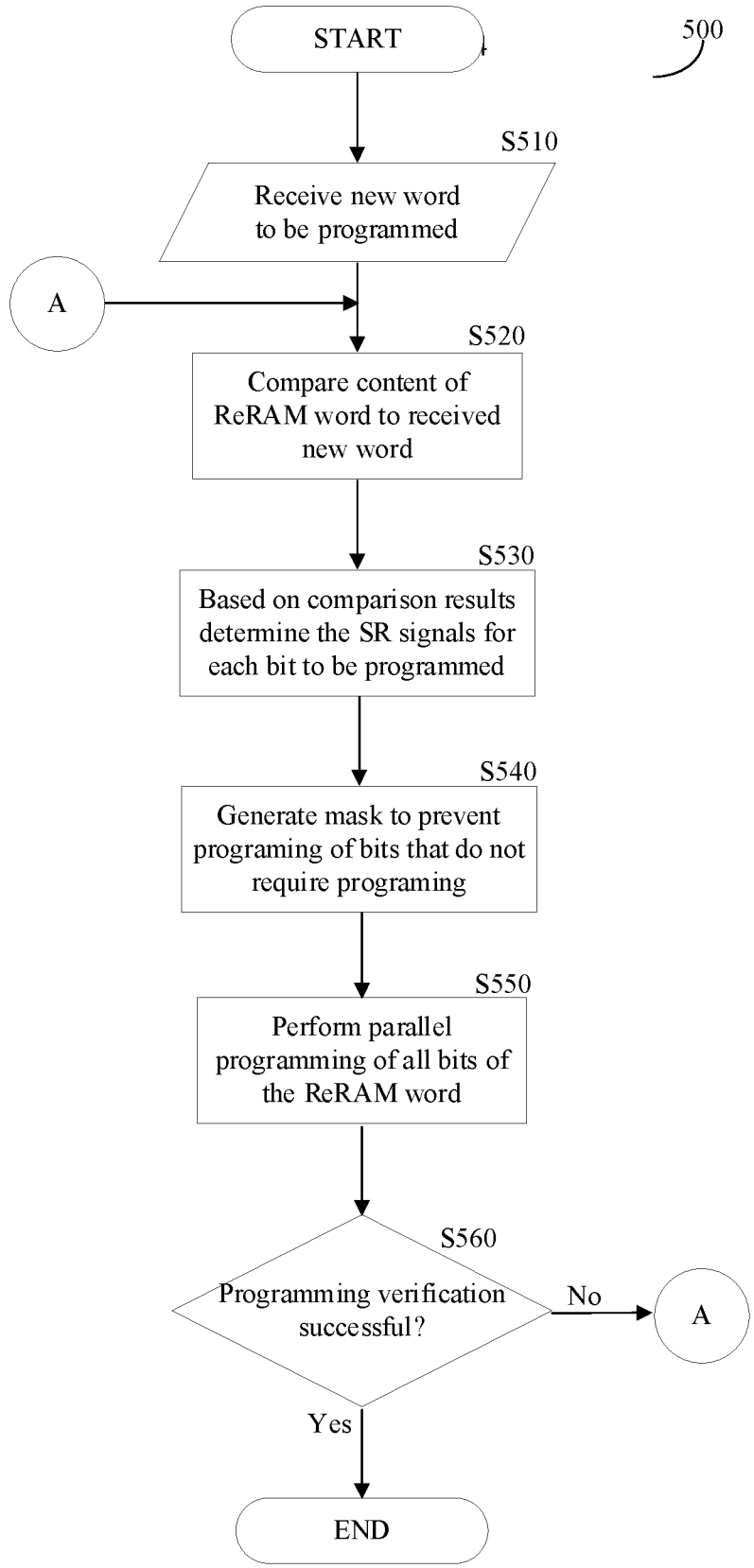
FIG. 5 is a flowchart of a parallel reset and set programming of a ReRAM word according to an embodiment.

FIG. 5 is an example flowchart 500 of a parallel reset and set programming of a

ReRAM word according to an embodiment. At S510, a word to be programmed into a word of a ReRAM is received, for example on bit lines 340. At S520, a comparison between the received word and the content of the ReRAM word to be written into is performed to find out which bits need to be programmed, i.e., either reset or set, and which do not need programming, i.e., remain with their previous content either '0' or '1'. At S530, based on the results of the comparison, the respective SR signals 360 for proper programming of each bit (i.e., ReRAM cell) within the word that needs to be programmed is determined.

That is, certain bits may have SR='0' for their respective BL/SL controller 350 to cause a reset programming, while other bits may have SR='1' for their respective BL/SL controller 350 to cause a set programming. At S540, a mask is generated to mask those bits of the word that are not to be changed and therefore not required to be programmed. At S550, the programming takes place by applying the generated SR signals, the respective word line 310 for the ReRAM word to be programmed and the mask to mask bits that may not need programming.

At S560, it is verified that programming has been successfully achieved and if so, execution terminates; otherwise, execution continues with S520. In an embodiment, the loop after verification is limited to a predetermined number of cycles after which the programming may be deemed unsuccessful. In an embodiment, successful programming may be verified by comparing (or matching) the received word to be programmed (at S510) and the programmed word at the ReRAM array (at S550).

Figure 6:
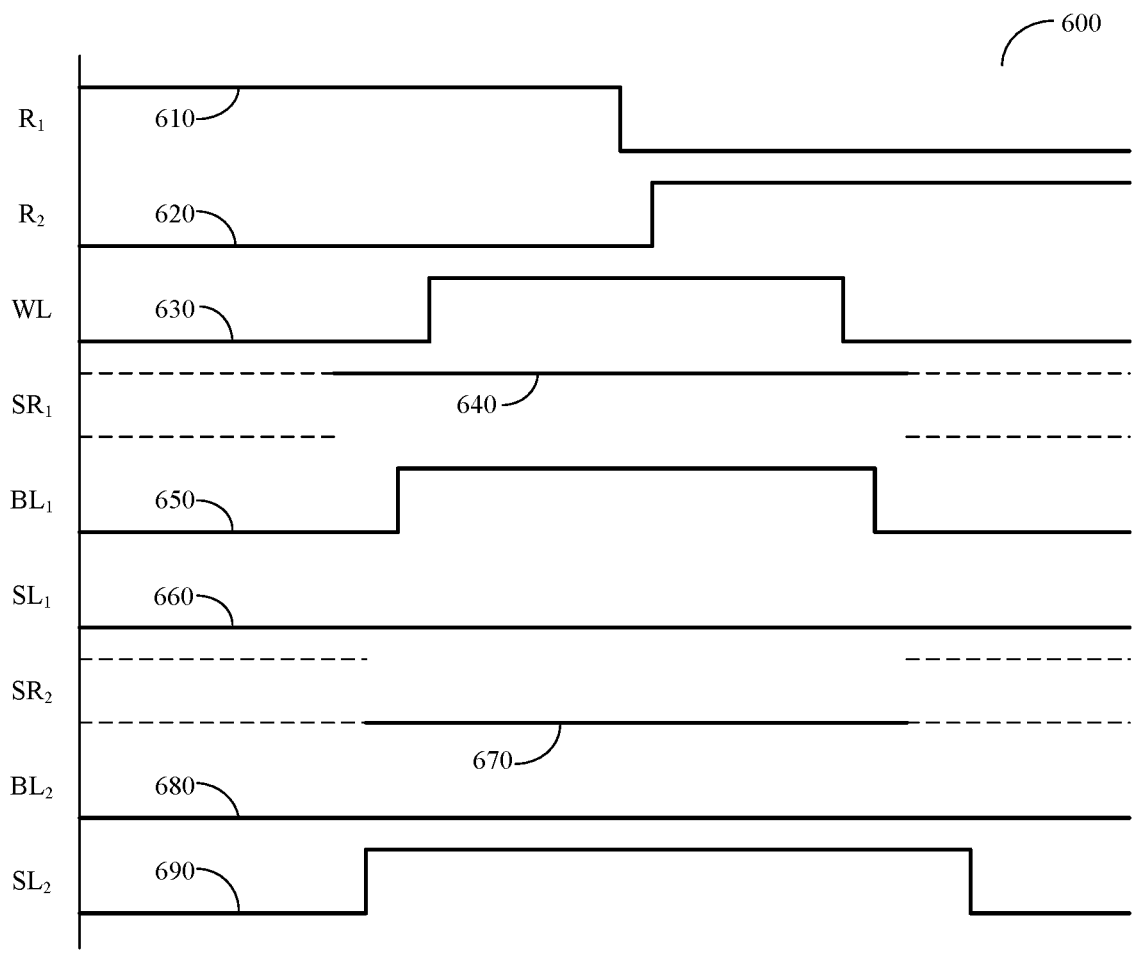
FIG. 6 is a schematic timing diagram for parallel programming of ReRAM cells of the same word according to an embodiment.

FIG. 6 is an example of a schematic timing diagram 600 for parallel programming of ReRAM cells of the same word according to an embodiment. In the example, two ReRAM cells, denoted "1" and "2" and as R1 and R2 in the timing diagram 600 are presented.

The initial state of R1 is at high resistance, for example 150 kilo-ohms, and the initial resistance of R2 is at low resistance, for example 10 kilo-ohms. Changes over time of the respective resistances R1 and R2 are shown by signal 610 and 620 respectively. The two ReRAM cells have a common world line denoted WL. Changes over time of the world line WL are shown by signal 630. Content programming of each of the ReRAM cells "1" and "2" is controlled by respective SR signals, operative as explained herein, where SR1 controls the set or reset programming of cell "1" while SR2 controls the set or reset programming of cell "2". Changes in SR over time are shown in timing signal 640 while changes in SR2 over time are shown in timing signal 670.

Each ReRAM cell is programmed by applying an appropriate signal on its respective BL and SL, that is, for ReRAM cell "1" BL1 and SL1 and for ReRAM cell "2" BL2 and SL2. Changes over time in signals BL1 and SL1 are shown in respective timing signals 650 and 660. Changes over time in signals BL2 and SL2 are shown in respective timing signals 680 and 690. In the example presented herein, a set programming of ReRAM cell "1", i.e., to change the resistance of R1 from a high-resistive state to a low-resistive state, and a reset programming of ReRAM cell "2", i.e., to change the resistance of R2 from a low-resistive state to a high-resistive state, may be performed in parallel, rather than serially as performed by the prior art. By using multiplexers and an SR control signal, as explained in more detail herein, the appropriate voltages for set and reset programming may be provided on the respective BL and SL of each ReRAM cell.

Therefore, SR1 is held at high as shown with timing signal 640 during the time where the WL 630 is at high (i.e., allowing the programming of the ReRAM cells controlled by WL 630). This allows for the set programming of ReRAM cell "1" to occur by providing a high voltage on BL1 650 and a low voltage on SL1 660, while WL 630 is at high. Therefore, SR2 is held at low as shown with timing signal 670 during the time where the WL 630 is at high (i.e., allowing the programming of the ReRAM cells controlled by WL 630).

This allows for the reset programming of ReRAM cell "2" to occur by providing a low voltage on BL2 680 and a high voltage on SL2 690, while WL 630 is at high. As a result, and as can be seen with respect of the resistances 610 and 620 that switch from high-resistance to low-resistance, and from low-resistance to high-resistance, respectively and in parallel. It should be appreciated that WL 630 may be 310-$i$ of FIG. 3, that SL1 may be 330-$j$–1, BL1 may be 340-$j$–1, SR1 may be 360-$j$–1, SL2 may be 330-$j$, BL2 may be 340-$j$, and SR2 may be 360-$j$. An ordinary skill in the art would appreciate that the relative timing between the signals shown may change without departing from the scope of the present disclosure, for example, but not by way of limitation, the changes shown for WL 630 may occur on a longer or shorter period of time or start or end at other relative times. The difference in applying of the high voltage for BL1 650 and SL2 690 may further be a result of a programming termination circuitry that may expedite or delay the end of the applying of the high voltage.

In an example embodiment, there is a ReRAM array with parallel reset and set programming. The ReRAM array comprises: a plurality of ReRAM cells arranged in an array, wherein the array includes a plurality of rows and a plurality of columns, wherein at least two ReRAM cells of an array includes a word, wherein each ReRAM cell includes a select device having a control port, a first port, and a second port, such that under the control of a signal applied to the control port, current may flow or not flow between the first port and the second port, and a resistive element including a top electrode (TE) and a bottom electrode (BE), wherein the control port is connected to a word line, the first port connected to a source line, the TE connected to a bit line, and the second port is connected to the BE; and a plurality of controllers, wherein the output of each of the plurality of controllers cause a reset programming or a set programming of the ReRAM cell in the column of the plurality of ReRAM cells that has the respective word line activated; such that the reset programming and the set programming occur in parallel.

In yet another example embodiment of the ReRAM array, each of the plurality of controllers further comprises: a first set/reset (SR) signal input, wherein the first SR signal input is configured to receive a first SR signal that is either at a first operational level or a second operational level; a first output communicatively connected to the source line of the column of the plurality of ReRAM cells; a second output communicatively connected to the bit line of the column of the plurality of ReRAM cells; a first multiplexer having a first input connected to a first voltage source and a second input connected to the first SR signal input, wherein upon the first SR signal presenting the first operational level, the first voltage source is connected to the first output and upon the first SR signal presenting the second operational level, the first voltage source is connected to the second output; and a second multiplexer having a third input connected to a second voltage source and a fourth input connected to the first SR signal input, wherein upon the first SR signal presenting the first operational level, the second voltage source is connected to the fourth output and upon the first SR signal presenting the second operational level, the second voltage source is connected to the third output.

In yet another example embodiment, a method for parallel reset and set programming of a resistive random-access memory (ReRAM) word of a ReRAM array, comprises: receiving a new word to be programmed into the ReRAM word of the ReRAM array, wherein the new word contains a plurality of bits, each bit being a ReRAM cell; comparing a content of the ReRAM word to be programmed to the received new word; determining, based on the comparison, a plurality of enable signals to each source line and bit line of the ReRAM word to be programmed; generating a mask to disable programming of a first portion of the plurality of bits of the ReRAM word that are not to be programmed and enable programming of a second portion of the plurality of bits of the ReRAM word that are to be programmed; performing parallel reset and set programming of the ReRAM word to be programmed while applying the mask; terminating programming upon checking the content of the ReRAM word that was programmed to be successful; and repeating programming upon determination that the content of the ReRAM word does not match the new word, wherein the repeating programming is performed using the received new word.

All examples and conditional language recited herein are intended for pedagogical purposes to aid the reader in understanding the principles of the disclosed embodiment and the concepts contributed by the inventor to furthering the art and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A resistive random-access memory (ReRAM) array with parallel reset and set programming comprising:
  a plurality of ReRAM cells arranged in an array, wherein the array includes a plurality of rows and a plurality of columns, wherein at least two ReRAM cells of the array includes a word, wherein each ReRAM cell includes a select device having a control port, a first port, and a second port, such that under a control of a signal applied to the control port, current is configured to flow or not flow between the first port and the second port, and a resistive element including a top electrode (TE) and a bottom electrode (BE), wherein the control port is connected to a word line, the first port connected to a source line, the TE connected to a bit line, and the second port is connected to the BE; and
  a plurality of controllers, wherein an output of each of the plurality of controllers causes a reset programming or a set programming of a ReRAM cell in a column of the plurality of ReRAM cells that has a respective word line activated;
  such that the reset programming and the set programming occur in parallel,
  wherein each of the plurality of the controllers further comprises:
  a first set/reset (SR) signal input, wherein the first SR signal input is configured to receive a first SR signal that is at any one of: a first operational level and a second operational level;
  a first output communicatively connected to the source line of the column of the plurality of ReRAM cells;
  a second output communicatively connected to the bit line of the column of the plurality of ReRAM cells;
  a first multiplexer having a first input connected to a first voltage source and a second input connected to the first SR signal input, wherein upon the first SR signal presenting the first operational level, the first voltage source is connected to the first output and upon the first SR signal presenting the second operational level, the first voltage source is connected to the second output; and
  a second multiplexer having a third input connected to a second voltage source and a fourth input connected to the first SR signal input, wherein upon the first SR signal presenting the first operational level, the second voltage source is connected to the second output and upon the first SR signal presenting the second operational level, the second voltage source is connected to the first output.

2. The ReRAM array of claim 1, wherein upon applying the first operational level of the first SR signal, a first voltage level is provided by the first voltage source and wherein upon applying the second operational level of the first SR signal, a second voltage level is provided by the first voltage source.

3. The ReRAM array of claim 1, wherein the first voltage source provides a higher voltage than a voltage provided by the second voltage source.

4. The ReRAM array of claim 3, wherein the first operational level is lower than the second operational level.

5. The ReRAM array of claim 3, further comprising:
  a termination circuitry for termination of programming of a ReRAM cell being programmed upon determination that programming has completed.

6. The ReRAM array of claim 5, wherein the termination circuitry further comprises:
  an input providing a current respective of a current flowing in the ReRAM cell being programmed;
  a second set/reset (SR) signal input, the second SR signal input connected to the first SR signal input;
  a termination signal output;
  a comparator having a plus input, a minus input, and an output, wherein the output is connected to the termination signal output;
  a third multiplexer having a signal input, a control input, a first output, and a second output, wherein the signal input of the third multiplexer is connected to the input providing a current respective of the current flowing in the ReRAM cell being programmed, wherein the control input is connected to the second SR signal input, wherein the first output of the third multiplexer is connected to the minus input of the comparator, and wherein the second output of the third multiplexer is connected to the plus input of the comparator; and
  a fourth multiplexer having an input receiving a reference current, a control input, a first output and a second output, wherein the control input is connected to the second SR signal input, wherein the first output of the fourth multiplexer is connected to the plus input of the comparator, and wherein the second output of the fourth multiplexer is connected to the minus input of the comparator;
  such that under control of the first SR signal, the reference current is directed to either the plus input of the comparator or the minus input of the comparator, while the current flowing in the ReRAM cell being programmed is directed to either the minus input of the comparator or the plus input of the comparator, respectively.

7. The ReRAM array of claim 1, wherein the select device is any one of: field effect transistor (FET), metal-oxide-silicon FET (MOSFET), FinFET, FET on silicon-on-insulator (SOI), and bipolar junction transistor (BJT).

8. The ReRAM array of claim 7, wherein the FET includes a gate port, a source port, and a drain port.

9. The ReRAM array of claim 8, wherein the gate port is the control port of the select device, wherein the source port is the first port of the select device, and wherein the drain port is the second port of the select device.

* * * * *